United States Patent [19]
Hudson, Jr.

[11] 3,725,825
[45] Apr. 3, 1973

[54] FILTERED SOCKET FOR ELECTRONIC CIRCUIT BOARD

[75] Inventor: William Jeffery Hudson, Jr., Hershey, Pa.

[73] Assignee: AMP Incorporated, Harrisburg, Pa.

[22] Filed: June 14, 1971

[21] Appl. No.: 152,883

[52] U.S. Cl. ....................333/79, 339/256, 339/258, 113/119

[51] Int. Cl. ...............................................H01h 7/14

[58] Field of Search ..333/79; 339/256, 258; 113/119

[56] References Cited

UNITED STATES PATENTS

| | | | |
|---|---|---|---|
| 3,002,162 | 9/1961 | Garstang | 333/79 X |
| 3,564,709 | 2/1971 | Hickton | 113/119 |
| 3,496,517 | 2/1970 | Walter | 339/256 X |
| 3,189,847 | 6/1965 | Rymaszewski | 333/79 X |
| 3,573,677 | 4/1971 | Detar | 333/79 |
| 3,218,606 | 11/1965 | Schultz | 339/256 |
| 3,435,387 | 3/1969 | Reinke et al. | 333/79 |

*Primary Examiner*—Hermann Karl Saalbach
*Assistant Examiner*—Saxfield Chatmon, Jr.
*Attorney*—William J. Keating et al.

[57] ABSTRACT

A filtered socket decouples the pin of an electronic circuit device such as a transistor or a thin film amplifier. The tubular socket is constructed of a resilient metal with a pin receiving opening at one end and a resilient tail at the other end. A tubular filter is soldered onto the socket. This filter has a metal flange which is positioned against the plated through circuit in a hole on the circuit board. The filtered socket is locked to the board by resiliently positioning the tail in another hole in the circuit board. The board is flow soldered to establish an electrical connection between the outer conductive surface of the filter and a common electronic connection extending to the hole in which the socket is positioned. Another electrical connection is established between the circuit extending to the other hole and the socket itself. A solder-free plastic coating on a portion of the filter and a portion of the tail prevents solder from bridging the two holes.

8 Claims, 1 Drawing Figure

FILTERED SOCKET FOR ELECTRONIC CIRCUIT BOARD

BACKGROUND OF THE INVENTION

This invention relates to filtered sockets to be mounted on electronic circuit boards and more particularly to a socket, and a method of fabricating, a socket for decoupling the circuit of a device to be mounted on a circuit board.

With the increasing complexity and miniaturization of modern electronic systems, many different pieces of equipment using highly sensitive and sophisticated circuitry are being packaged in a minimum of space. Since such equipment must operate in close proximity to each other and because of the increased sensitivity of the circuits themselves, the equipment as well as the system have become more and more susceptible to electromagnetic interference (EMI). This interference is the result of the magnetic and electric fields generated in internally, within equipment circuits, or externally, by adjacent equipment. It can occur at any and all frequencies within the radio frequency (RF) spectrum. If left unchecked or inadequately controlled, it will not only impair the performance of the equipment, but in some instances, can make it totally inoperative. As a result, there has been an ever-increasing need to reduce the effects of EMI in compact and sophisticated electronic equipment.

Subminiature suppression filters have been developed to provide control of electromagnetic interference in tightly packaged spaces. Filters of the type shown in U. S. Pat. No. 3,275,953 — Coda et al have been developed for use as feedthrough filters or on connector pins. These filters are small and have good insertion loss characteristics. Usually, they include an inner sleeve, or tubular member, of ferrite coated with a conductive metal layer. A dielectric, usually barium titanate, is coated on this tubular member. An outer layer of conductive metal completes the filter.

RELATED APPLICATIONS

Ser. No. 883,501, William B. Fritz, COATED FERRITE RF FILTERS, discloses a filter particularly suitable for use in the present invention.

SUMMARY OF THE INVENTION

In accordance with this invention, a miniature filtered socket can be quickly and economically installed on an electrical circuit board.

The socket itself is of the tubular type which has a pin-receiving opening at one end thereof and a resilient tail extending from the other end thereof. A tubular ceramic type filter is soldered to the socket near one end thereof.

The filtered socket can be easily installed on a circuit board such as a printed circuit board. The socket is positioned in a plated through hole to which the common connection extends. The filtered socket is locked on the board by resiliently positioning the tail of the socket in another hole.

In accordance with an important aspect of this invention the filtered connector can be flow soldered to make the electrical connections to the circuit board. One feature which makes this possible is that the construction of the filtered socket is such that it will withstand the heat of flow soldering without damage to the filter. Another feature which allows flow soldering is that a portion of the filter and a portion of the tail of the socket are coated with a solder-free plastic. During flow soldering this coating prevents solder from bridging across the outer conductive coating of the filter and the circuit to which the socket is connected. Of course, if such bridging occurs the desired electrical properties of the filter are lost but this is avoided by the present invention.

The foregoing and other objects, features and advantages of the invention will be better understood from the following more detailed description, appended claims and drawings.

DESCRIPTION OF A PARTICULAR EMBODIMENT

Figure 1:
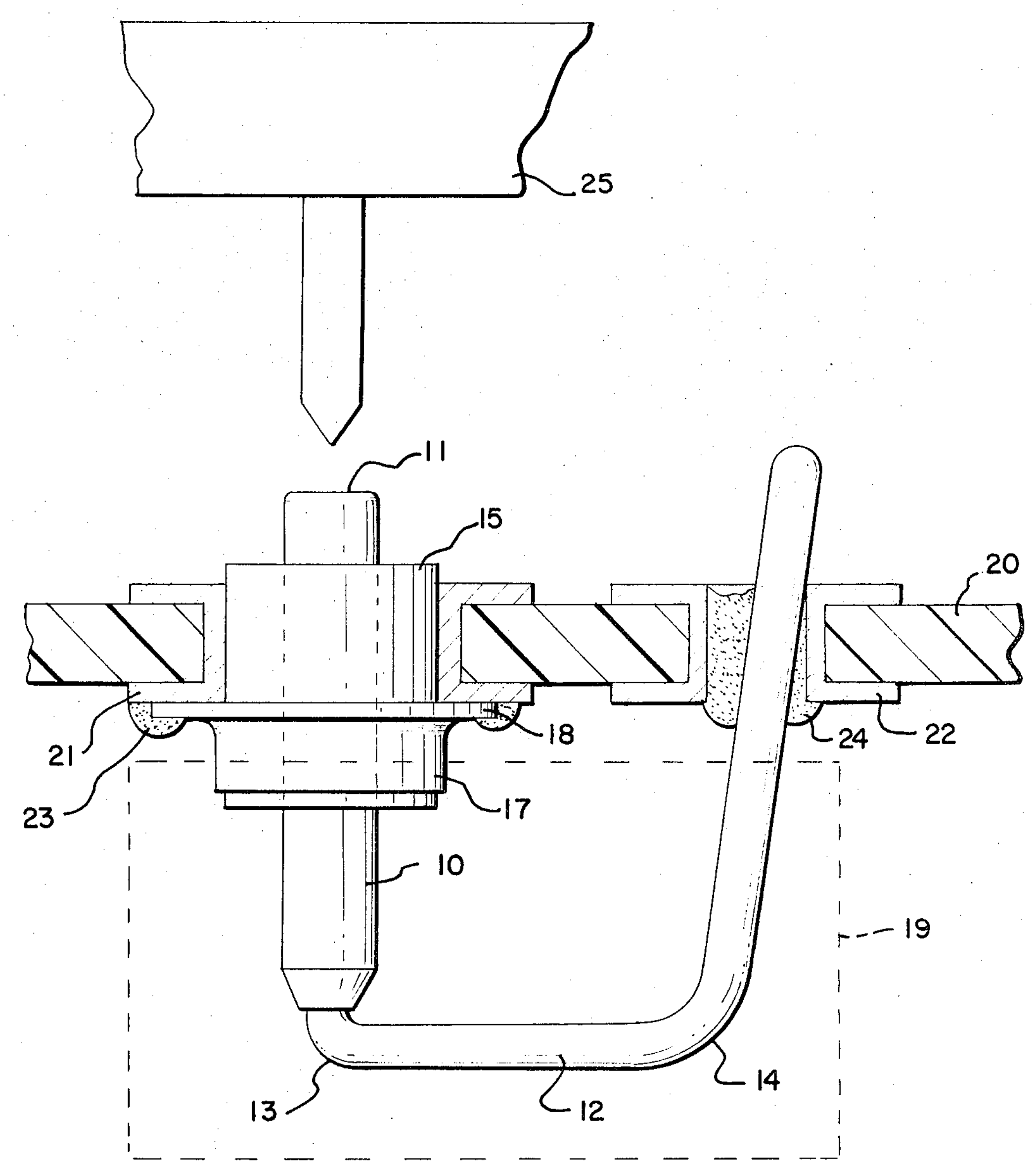
FIG. 1 shows the filtered socket in place on a circuit board which is shown in section.

Referring to FIG. 1, the filtered socket includes the tubular pin-receiving socket 10. This socket is constructed of resilient metal and has an opening at the end 11 for receiving a pin of an electronic circuit device such as a transistor or a thin film amplifier. The socket has a resilient tail 12. Typical sockets which are suitable for use with this invention are shown in U.S. Pat. Nos. 3,286,671, 3,222,632 and patent application Ser. No. 558,953.

The tail of the socket is bent at 13 and at 14. Each of these bends is at least 90°. As depicted here the bend 13 is 90° minimum and the bend 14 is 110°.

A tubular filter 15 is soldered to the socket near the pin-receiving end. The soldering establishes an electrical connection between the socket 10 and the inner conductive surface of the filter.

A brass eyelet 17 having a flange 18 is soldered to the filter.

A solder-free plastic coating is placed on a portion of the filter and a portion of the tail. This portion is outlined by the dashed lines denoted 19. One example of a solder-free plastic which is suitable for coating is a modified imide polymer such as that supplied by Electro-Science Laboratories, Philadelphia, Pennsylvania under their designation 55HD.

The structure described thus far is a filtered socket having particular advantages. It is sold as an item of commerce for assembly on printed circuit boards. A printed circuit board 20 includes plated through holes for receiving circuit devices. Circuit connections extend to these plated through holes. For example, the printed circuit 21 is a common circuit, usually a ground plane. The circuit 22 may be the DC power bus.

In assembling the device on the circuit board the filtered socket is positioned in the hole with the flange 18 bearing against the common circuit 21. The filtered socket is locked on the board by resiliently positioning the tail in the other hole with the tail bearing against the circuit 22. Then the circuit board is flow soldered. The solder at 23 establishes an electrical connection between the outer conductive coating of the filter and the common circuit 21. The solder at 24 establishes an electrical connection between the tail and the DC power bus 22.

A transistor or a thin film amplifier 25 commonly has a plurality of pins including a pin to which DC power is supplied. This pin is inserted in the opening 11 in the socket 10. Note that the filter 15 is connected between the socket and the common connection 21. This filter decouples the DC power and suppresses UHF interference which might otherwise be transferred from other circuitry through the DC power bus to the device 25.

One further advantage of the invention should be noted. When using a ferrite and barium titanate filter such as that described in the aforementioned Fritz patent application Ser. No. 883,501 no damage will be done to the filter during flow soldering. The flow soldering temperature is approximately 250°C. and the filter will not be damaged at this temperature.

While a particular embodiment has been shown and described modifications will be apparent. The appended claims are, therefore, intended to cover any such modifications.

What is claimed is:

1. A filtered socket arrangement for decoupling the inserted pins of an electronic circuit device to be mounted on a circuit board comprising:

a tubular socket having an opening at one end thereof for receiving one of said pins and having a resilient tail secured at the other end thereof, a tubular filter of the type having an inner conductive surface and an outer conductive surface separated by dielectric material, said tubular socket being secured within said tubular filter in conductive engagement with the inner conductive surface thereof, and a metal flange on said filter so that said filtered socket can be mounted in one hole in said circuit board with the flange against a surface of the board and said tail resiliently bearing against the wall of another hole to retain said filter and socket assembly on said board by the resiliency of the tail.

2. The filtered socket recited in claim 1 wherein said tail portion has two bends of at least 90° each so that said socket can be in one hole in said circuit board with said tail extending into another hole in the same plane of said circuit board.

3. The filtered socket recited in claim 1 wherein said flange is on a metallic eyelet secured to and about the outer conductive surface of said filter.

4. The filtered socket recited in claim 1 wherein a coating of a solder-free plastic is provided on a portion of the outer conductive surface of said filter and a portion of said tail which extends from said filter so that said socket can be dip soldered to said board without forming a solder bridge between the outer conductive surface of said filter and the end of said tail bearing against said other hole.

5. The socket recited in claim 1 wherein said filter comprises a ferrite tube coated with barium titanate so that said filtered socket can be dip soldered to said circuit without causing heat damage to said filter.

6. The method of assembling a filtered socket to a circuit board of the type having electronic circuit connections extending between holes which receive circuit devices comprising:

soldering the inner conductive surface of a tubular filter having a surrounding flange to the outer surface of a tubular socket mounted therein near the pin receiving end of said socket, said socket having a resilient tail extending therefrom, positioning said filter socket in a hole in a circuit board with said flange bearing against a common electronic circuit connection extending to that hole, and locking said filtered socket on said circuit board by resiliently positioning said tail in another hole having a conductor of the electronic circuit therein.

7. The method of claim 6 including the step of coating a portion of the outer conductive surface of said filter and a portion of said tail with solder free plastic.

8. The method recited in claim 7 further comprising:

dip soldering said circuit board to establish an electrical connection between the outer conductive surface of said filter and said common electronic circuit, and to establish an electrical connection between said socket and the conductor of the electronic circuit extending to said other hole, said coating preventing solder from establishing an electrical circuit between the outer conductive surface of said filter and said socket.

* * * * *